(12) United States Patent
Jeong et al.

(10) Patent No.: US 12,178,026 B2
(45) Date of Patent: Dec. 24, 2024

(54) DISPLAY DEVICE

(71) Applicants: Samsung Display Co., LTD., Yongin-si (KR); Sookmyung Women's university industry-academic cooperation foundation, Seoul (KR)

(72) Inventors: Wee-Joon Jeong, Seongnam-si (KR); Jang Un Choi, Seoul (KR); Woosung Park, Seoul (KR); Nayeong Ki, Cheonan-si (KR); Yoon Jin Kim, Anyang-si (KR)

(73) Assignees: SAMSUNG DISPLAY CO., LTD., Yongin-si (KR); SOOKMYUNG WOMEN'S UNIVERSITY INDUSTRY-ACADEMIC COOPERATION FOUNDATION, Seoul (KR)

( * ) Notice: Subject to any disclaimer, the term of this patent is extended or adjusted under 35 U.S.C. 154(b) by 342 days.

(21) Appl. No.: 17/710,234

(22) Filed: Mar. 31, 2022

(65) Prior Publication Data
US 2022/0330462 A1  Oct. 13, 2022

(30) Foreign Application Priority Data
Apr. 7, 2021  (KR) .................. 10-2021-0045381

(51) Int. Cl.
*H05K 7/20*  (2006.01)
*H05K 9/00*  (2006.01)

(52) U.S. Cl.
CPC ..... *H05K 7/20972* (2013.01); *H05K 7/20954* (2013.01); *H05K 9/0024* (2013.01)

(58) Field of Classification Search
CPC .......... H05K 7/20972; H05K 7/20954; H05K 9/0024; G06F 1/20
See application file for complete search history.

(56) References Cited

U.S. PATENT DOCUMENTS

| 7,287,879 B2 * | 10/2007 | Hsu ................... H05K 7/20963 362/294 |
| 2004/0116065 A1 * | 6/2004 | Oh ..................... H05K 7/20172 454/184 |

(Continued)

FOREIGN PATENT DOCUMENTS

| EP | 2 912 399 | 9/2015 |
| JP | 2011-119600 | 6/2011 |

(Continued)

OTHER PUBLICATIONS

Zheyuan Zhang et al., "Flow Characteristic and Heat Transfer for Non-Newtonian Nanofluid in Rectangular Microchannels with Teardrop Dimples/Protrusions", Open Phys., 2017, pp. 197-206, vol. 15.

*Primary Examiner* — Sagar Shrestha
(74) *Attorney, Agent, or Firm* — KILE PARK REED & HOUTTEMAN PLLC

(57) ABSTRACT

A display device includes a display panel; a chassis disposed at a rear side of the display panel; a control circuit board disposed on the chassis; a shield case disposed on the control circuit board; and a fan disposed on the chassis and adjacent to the shield case. The shield case includes a main portion spaced apart from the control circuit board in a third direction, and side portions extending toward the chassis from opposite sides of the main portion. Dimples are formed in an inner surface of the main portion facing toward the control circuit board.

20 Claims, 15 Drawing Sheets

(56) References Cited

U.S. PATENT DOCUMENTS

| | | | |
|---|---|---|---|
| 2008/0170400 A1* | 7/2008 | Maruyama | G02F 1/133603 |
| | | | 361/679.06 |
| 2013/0058039 A1* | 3/2013 | Lee | G06F 1/203 |
| | | | 361/690 |
| 2014/0218851 A1* | 8/2014 | Klein | G06F 1/182 |
| | | | 361/679.02 |
| 2017/0049006 A1* | 2/2017 | McLaughlin | H01L 23/3672 |
| 2018/0053462 A1* | 2/2018 | Bae | G09G 3/2074 |
| 2018/0153038 A1* | 5/2018 | Kim | H05K 5/03 |
| 2019/0021189 A1* | 1/2019 | Kim | H05K 7/20209 |
| 2020/0107458 A1* | 4/2020 | Park | G06F 1/20 |
| 2021/0041926 A1* | 2/2021 | Park | G06F 1/203 |
| 2021/0309901 A1* | 10/2021 | Hwang | C09J 7/29 |
| 2022/0050513 A1* | 2/2022 | Garelli | H05K 9/0037 |
| 2022/0121058 A1* | 4/2022 | Shi | G02F 1/133385 |

FOREIGN PATENT DOCUMENTS

| | | |
|---|---|---|
| JP | 2014-186069 | 10/2014 |
| KR | 10-2005-0072219 | 7/2005 |

\* cited by examiner

DISPLAY DEVICE

CROSS-REFERENCE TO RELATED APPLICATION(S)

This application claims priority to and benefits of Korean Patent Application No. 10-2021-0045381 under 35 U.S.C. § 119, filed on Apr. 7, 2021, in the Korean Intellectual Property Office, the entire contents of which are incorporated herein by reference.

BACKGROUND

1. Technical Field

This disclosure relates to a display device including a shield case with improved cooling performance.

2. Description of the Related Art

A display device such as a light emitting display device, or a liquid crystal display may include a display panel that provides a screen for displaying an image. The display device may also include driving elements for the display panel, a power supply element, and the like. Heat is generated from the driving elements, power elements, and the like, and performance may deteriorate, or the display device may be damaged when heat-generating elements (heating elements) are not effectively cooled.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are to provide a display device with improved cooling performance for heating elements.

A display device according to an embodiment may include a display panel; a chassis disposed at a rear side of the display panel; a control circuit board disposed on the chassis; a shield case disposed on the control circuit board; and a fan disposed on the chassis and adjacent to the shield case. The shield case may include a main portion spaced apart from the control circuit board in a third direction and side portions extending toward the chassis from opposite sides of the main portion. Dimples may be formed in an inner surface of the main portion facing toward the control circuit board.

Each of the dimples may be concave with respect to the inner surface of the main portion and may have an asymmetric shape.

A ratio of a depth to a diameter of the each of the dimples may be about 0.1 or more.

The shield case may include an opening formed in at least one of the side portions. The opening may not overlap the dimples in a second direction in which the opening penetrates the at least one of the side portions.

The display device may further include a signal controller disposed on the control circuit board. The dimples may overlap at least a part of the signal controller.

The shield case may include a rib disposed between adjacent ones of the dimples. The rib may protrude toward the control circuit board in the third direction from the inner surface of the shield case.

The dimples and the rib may not overlap each other.

The rib may include a first part extending in a direction intersecting a second direction at a first angle, and a second part extending in a direction intersecting the second direction at a second angle. The first part and the second part may intersect an angle of about 60° to about 120°.

A distance between the rib and a center of a dimple adjacent to the rib may be substantially equal to a distance between straight lines passing centers of adjacent ones of the dimples in the second direction.

The display device may further include a printed circuit film electrically connected to the display panel; a source circuit board electrically connected to the printed circuit film; and a cable electrically connecting the source circuit board and the control circuit board. The source circuit board may be disposed between the display panel and the chassis. The chassis may be disposed between the display panel and the control circuit board. The cable may electrically connect the source circuit board and the control circuit board through a hole disposed in the chassis.

A display device according to an embodiment may include a display panel; a chassis disposed on the display panel; a printed board assembly disposed on the chassis and including a signal controller; and a shield case covering the printed board assembly. Dimples may be formed in the shield case. Each of the dimples may be concave with respect to an inner surface and may have an asymmetric shape.

The display device may further include a fan disposed adjacent to the shield case and providing an airflow to a space defined by the printed board assembly and the shield case. A deepest point in each of the dimples may be farther from the fan than a center of a circular arc of each of the dimples.

A radio of a depth to a diameter of each of the dimples may be about 0.1 or more.

The shield case may include a main portion where the dimples are formed, a side portion extending toward the printed board assembly from the main portion, and an opening formed in the side portion. The opening may not overlap the dimples in a thickness direction of the side portion The dimples may overlap at least a part of the signal controller.

The shield case may include a rib disposed between adjacent ones of the dimples. The rib may protrude toward the control circuit board from the inner surface.

The dimples and the rib may not overlap each other.

The rib may have a "V" shape.

The display device may further include a printed circuit film electrically connected to the display panel; a source circuit board electrically connected to the printed circuit film; and a cable electrically connecting the source circuit board and the printed board assembly. The source circuit board may be disposed between the display panel and the chassis. The chassis may be disposed between the display panel and the printed board assembly. The cable may electrically connect the source circuit board and the printed board assembly through a hole formed in the chassis.

The display device may further include a source driver disposed on the printed circuit film and applying a data voltage to the display panel, wherein the signal controller may provide image data and a control signal to the source driver.

In the embodiments, it is possible to improve the cooling effect for the heating elements mounted on the circuit board by forming asymmetric dimples in the shield case of the display device. According to the embodiments, there are advantageous effects that can be recognized throughout the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
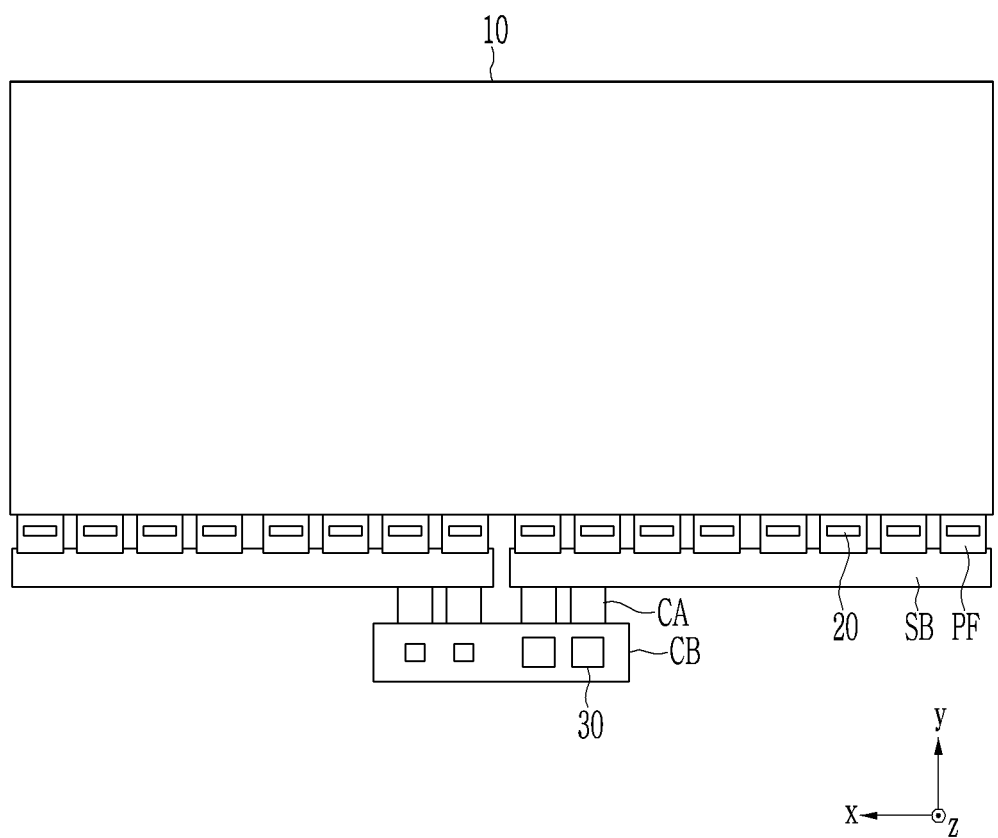
FIG. 1 is a schematic top plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless explicitly described to the contrary, the word "comprise", and variations such as "comprises" or "comprising", will be understood to imply the inclusion of stated elements but not the exclusion of any other elements.

In addition, when "connected to" in the entire specification, this does not only mean that two or more constituent elements are directly connected, but also means that two or more constituent elements are indirectly connected, physically connected, and electrically connected through other constituent elements, or being referred to by different names depending on the position or function, while being integral.

It will be understood that the terms "connected to" or "coupled to" may include a physical or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the drawings, the signs "x", "y", and "z" are used to indicate the direction, where "x" is a first direction, "y" is a second direction that is perpendicular to the first direction, and "z" is a third direction that is perpendicular to the first direction and the second direction. The first direction (x), second direction (y), and third direction (z) may correspond to the horizontal direction, vertical direction, and thickness direction of the display device, respectively.

Unless otherwise stated in the specification, "overlapping" means overlapping in a plan view, and overlapping in the third direction (z).

FIG. 1 is a schematic plan view of a display device according to an embodiment.

Referring to FIG. 1, a display device may include a display panel 10 and driving elements for driving the display panel 10.

The display panel 10 may provide a screen for displaying an image. The display panel 10 may include a substrate and pixels disposed on the substrate. The pixels may be arranged with a matrix format, and an image can be displayed by a combination of pixels. The pixels may be implemented as light emitting elements such as light emitting diodes, and pixel circuit portions including transistors and capacitors may be electrically connected to the light emitting elements. The display panel 10 may include a pixel circuit layer where the pixel circuit portions are located, a light emitting element layer where the light emitting elements are located, and an encapsulation layer that covers the light emitting element layer on the substrate.

The driving elements may generate/process various signals for driving the display panel 10. The driving elements may include a scan driver (not shown), a source driver 20, and a signal controller 30. The scan driver may apply a scan signal to the pixel circuit portion, and the source driver 20 may apply a data voltage to the pixel circuit portion. The signal controller 30 receives an image signal and a control signal, and may generate control signals including signals that control the scan driver and the source driver 20, and image data. The signal controller 30 may provide a scan control signal to the scan driver, and may provide a source control signal and the image data to the source driver 20. The scan driver may be integrated to an edge of the display panel 10. The source driver 20 and the signal controller 30 may be provided in the form of an integrated circuit (IC) chip (hereinafter, the IC chip will also be referred to as an IC). The scan driver, the source driver, and the signal controller may be respectively referred to as a gate driver, a data driver, and a timing controller.

The display device may include a printed circuit film PF electrically connected to the display panel 10. The printed circuit film PF may be referred to as a flexible printed circuit board. The printed circuit film PF may be bonded to the display panel 10 through an anisotropic conductive layer. The source driver 20 may be disposed on the printed circuit film PF.

The display device may include a source circuit board SB and a control circuit board CB. The printed circuit film PF may be electrically connected to the source circuit board SB. The source circuit board SB may be electrically connected to the control circuit board CB through a cable CA. The source circuit board SB may or may not be flexible. The cable CA may be a flat flexible cable (FFC).

The display device may include a set cover (not shown), and constituent elements of the display device shown in FIG. 1 may be disposed in the set cover. In the set cover, the printed circuit film PF is bent and thus the source circuit board SB and the control circuit board CB may be disposed in the rear side of the display panel 10. Accordingly, the size of bezel of the display device used in a monitor, a television, and the like can be reduced.

The signal controller 30 may be disposed in the control circuit board CB. The control circuit board CB where the signal controller 30 and the like are mounted may be referred to as a printed board assembly PBA. In addition to the signal controller 30, a power management integrated circuit (PMIC) may be mounted on the control circuit board CB.

Figure 2:
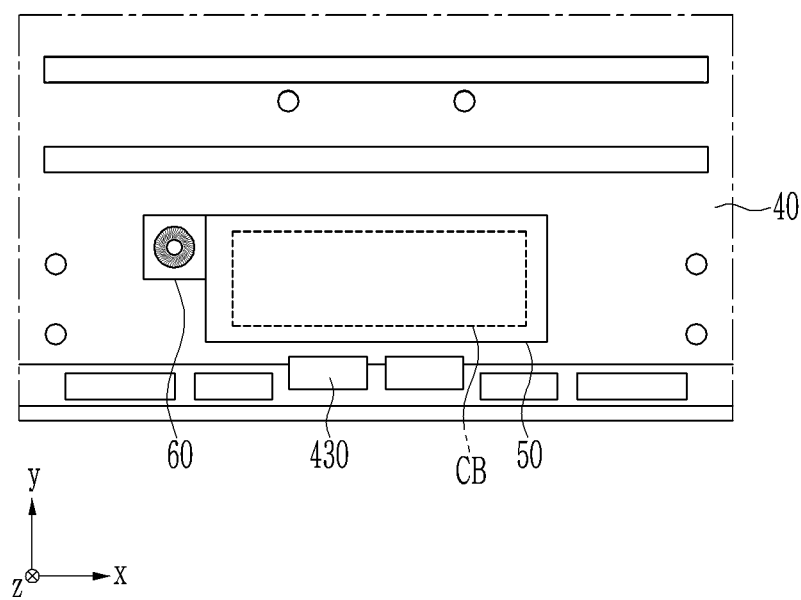
FIG. 2 is a plan view that schematically illustrates the rear side of the display device according to an embodiment.
Figure 3:
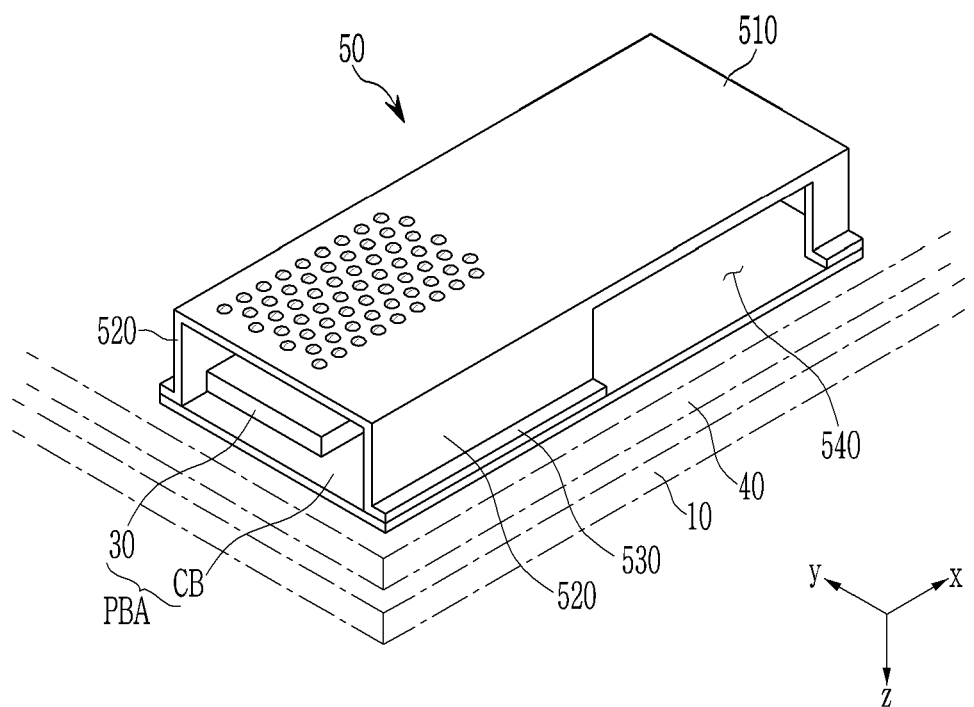
FIG. 3 is a perspective view that schematically illustrates the periphery of a shield case in the display device according to an embodiment.

FIG. 2 is a plan view that schematically illustrates the rear side of the display device according to an embodiment, and FIG. 3 is a perspective view that schematically illustrates the periphery of a shield case in the display device according to an embodiment.

Referring to FIG. 2 and FIG. 3, a chassis 40 may be disposed in the rear side of the display panel 10. The chassis 40 protects the display panel 10, and may be served as a support plate that fixes several parts that form the display device. The chassis 40 may include a metal or a metal alloy, and for example, may be formed of stainless steel. The chassis 40 may be referred to as a bottom chassis, a back chassis, and the like.

Referring to FIG. 1, the source circuit board SB may be disposed between the display panel 10 and the chassis 40, and the chassis 40 may be disposed between the display panel 10 and the control circuit board CB. The control circuit board CB is covered by the shield case 50. Thus, the source circuit board SB, the chassis 40, the control circuit board CB, and the shield case 50 may be sequentially disposed on the rear side of the display panel 10. The chassis 40 may include a hole 430 through which the cable CA or a connector of the cable CA can pass through, thereby electrically connecting the source circuit board SB and the control circuit board CB with the cable CA. The hole 430 may overlap the source circuit board SB that is disposed between the display panel 10 and the chassis 40. Although the cable CA and/or the source circuit board SB are not illustrated in FIG. 2 and FIG. 3, the disposition of the cable CA and the source circuit board SB can be clearly understood by referring to FIG. 1.

The shield case 50 may protect the printed board assembly PBA and shield against EMI. The shield case 50 may include a metal or a metal alloy, and for example, may be formed of stainless steel or an aluminum alloy. The control circuit board CB and the shield case 50 may be fixed to the chassis 40 by a fixing means such as a screw and the like. A fan 60 that blows air towards the shield 50 may be disposed at one side of the shield case 50 (refer to FIG. 2).

The shield case 50 may have a shape that is bent in approximately a "C" shape. The shield case 50 may include a main portion 510 and a side portion 520. The main portion 510 may have a quadrangle flat shape. The main portion 510 may be parallel to the control circuit board CB and the control circuit board CB at a predetermined distance in the third direction (z). The main portion 510 may be spaced apart from the signal controller 30 mounted on the control circuit board CB in the third direction (z). The side portion 520 may extend approximately in the third direction (z) toward the chassis 40 from opposite sides of the main portion 510. Accordingly, the shield case 50 may have the same shape as a tunnel. The shield case 50 may further include a wing portion 530 that extends approximately in the second direction (y) from the side portion 520. A screw for fixing the shield case 50 may pass through, for example, the wing portion 530 and be fixed to the chassis 40. The control circuit board CB may be disposed within the shield case 50 or may partially overlap the shield case 50.

Dimples DP are formed in at least a part of the main portion 510. The dimples DP may be formed concave from an inner surface of the main portion 510 (i.e., the surface facing the control circuit board CB). On an outer surface of the main portion 510 opposite to the inner surface, a region corresponding to the dimple DP may be convex. The dimple DP may be concave when viewed from the inner surface of the main portion 510 and convex when viewed from the outer surface of the main portion 510. Due to the dimples DP, the main portion 510, for example, the inner surface of the main portion 510, may include a portion that is not smooth and is uneven. A cooling path may be formed inside the shield case 50 by the dimples DP, and the dimples DP may improve cooling efficiency by generating turbulence.

The area in which the dimples DP are formed may be about 90% or less, about 70% or less, about 50% or less, or about 30% or less of the entire area of the main portion 510. The dimples DP may be formed in an area where elements generating high heat (high-heating elements) such as the signal controller 30 and the PMIC are positioned in the printed board assembly PBA. The dimples DP may be disposed to overlap the high-heating elements in the printed board assembly PBA.

An opening 540 may be formed in the side portion 520. The opening 540 may be provided for electrically connecting the control circuit board CB inside the shield case 50 and constituent elements outside the shield case 50. For example, the cable CA may be electrically connected to the control circuit board CB inside the shield case 50 through the opening 540. The opening 540 may be disposed so as to not overlap the dimples DP in the second direction (y).

The shield case 50 that includes the main portion 510 formed with the dimples DP and the side portion 520 with the opening 540 may be manufactured by a pressing process on a metal plate. The shield case 50 may have a thickness of about 0.5 mm or more, or about 0.8 mm to about 1.0 mm.

Figure 4:
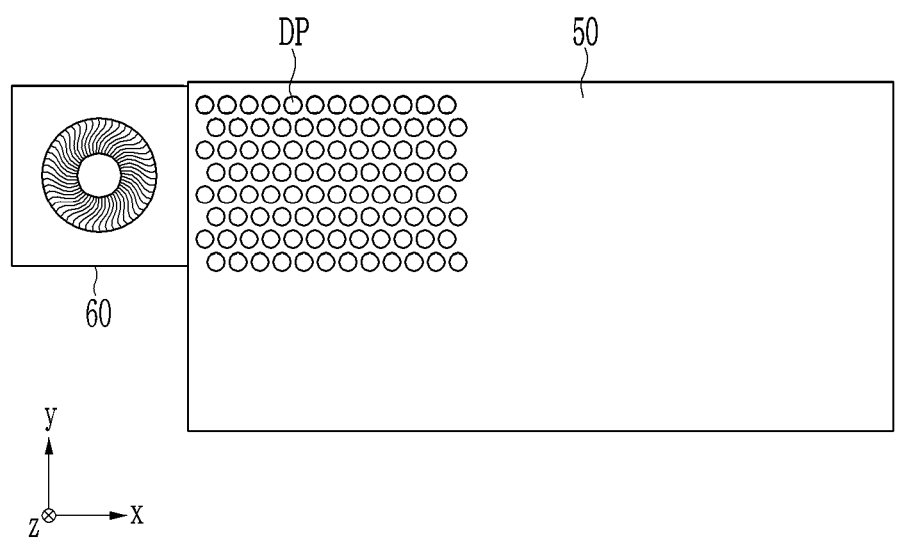
FIG. 4 is a schematic plan view of the shield case according to an embodiment.
Figure 5:
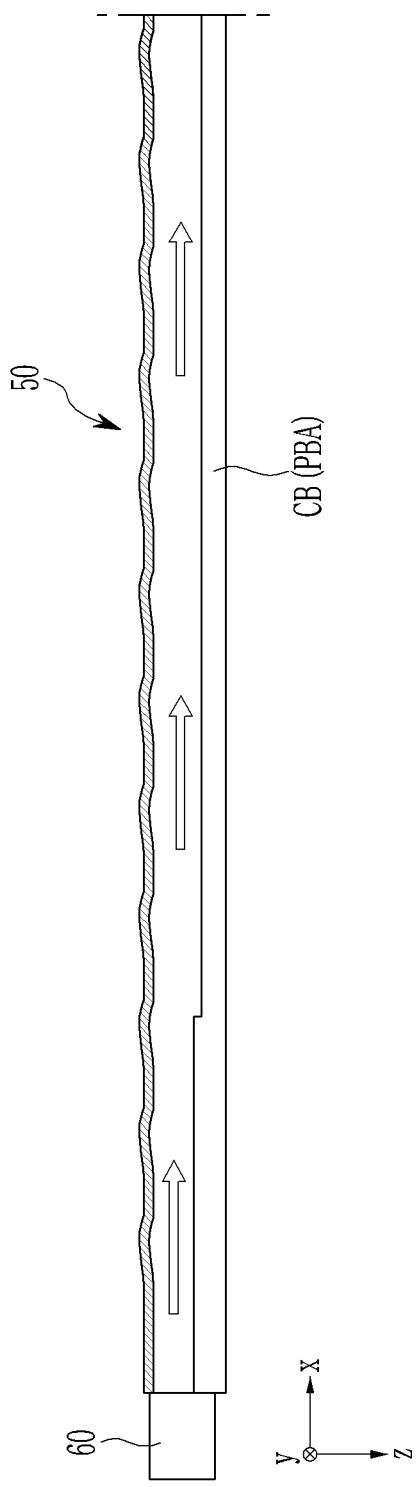
FIG. 5 is a schematic cross-sectional view of the area where the dimples are formed in the shield case according to an embodiment.
Figure 6:
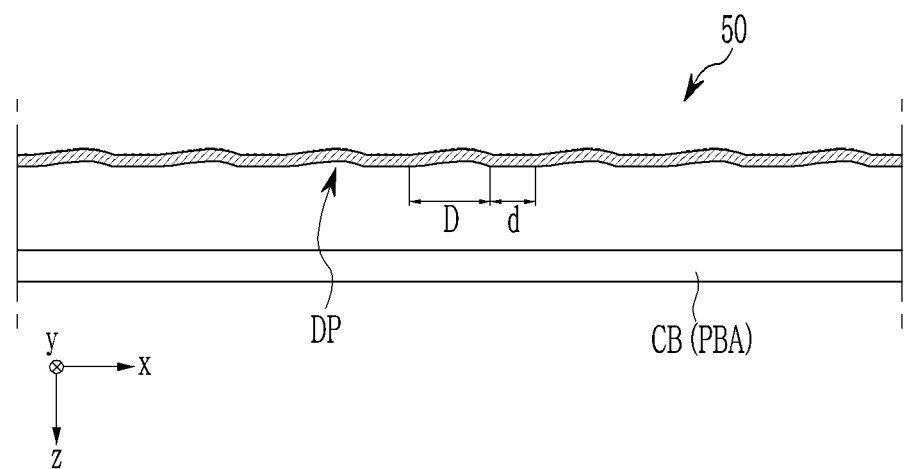
FIG. 6 is an enlarged schematic cross-sectional view of the shield case shown in FIG. 5.
Figure 7:
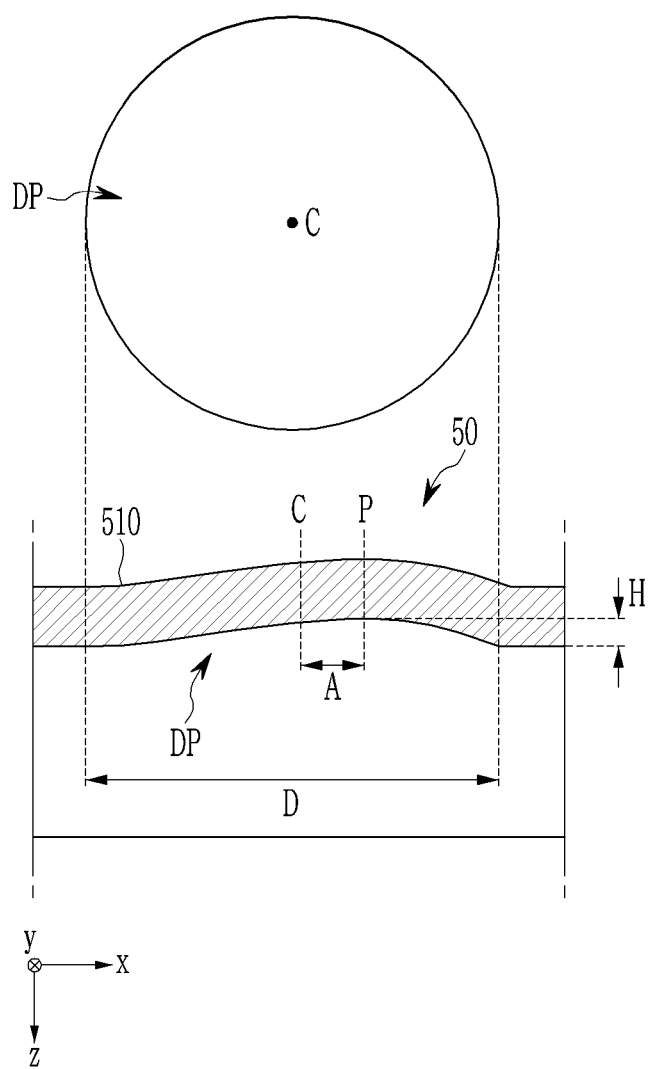
FIG. 7 is a schematic plan view and a schematic cross-sectional view of a single dimple in the shield case shown in FIG. 5.

FIG. 4 is a schematic top plan view of the shield case according to an embodiment, and FIG. 5 is a cross-sectional view of the area where the dimples are formed in the shield case according to an embodiment. FIG. 6 is an enlarged schematic cross-sectional view of the shield case shown in FIG. 5, and FIG. 7 is a schematic plan view and a schematic cross-sectional view of a single dimple in the shield case shown in FIG. 5.

Referring to FIG. 4 and FIG. 5, the display device may include the fan 60 disposed adjacent to the shield case 50 at one side of the shield case 50. The fan 60 may provide (blow) airflow to a space limited by the shield case 50 and the printed board assembly PBA. Since the printed board assembly PBA is covered by the shield case 50, the airflow generated by the fan 60 can cool the printed board assembly PBA while passing between the shield case 50 and the printed board assembly PBA. For example, the airflow can cool the signal controller 30 while passing through the space between the upper surface and/or the side of the signal controller 30, which is a heating element, and the shield case 50. Therefore, the shield case 50 and the fan 60 can constitute a cooling system for the printed board assembly PBA in the display device.

Due to the dimples DP formed in the main portion 510 of the shield case 50, the airflow provided by the fan 60 forms turbulence. The cooling performance can be improved due to the turbulent flow effect by the dimples DP. Cooling performance can thereby be improved in areas overlapping the dimples DP. Therefore, the dimples DP may be disposed to overlap with high-heating elements such as signal the controller 30 and the PMIC. As the area where dimples DP is formed increases, the area where turbulence occurs increases. As the turbulence increases, internal pressure increases, and thus fan efficiency may be reduced. Thus, although the dimples DP can be formed over the entire area of the main portion 510, it may be advantageous to form the dimples DP only in the area overlapping the elements requiring cooling. The dimple DP is circular in a plan view, but is not limited thereto, and may be, for example, an oval.

As described above, the opening 540 formed in the side portion 520 may be disposed so as not to overlap the dimples DP in the second direction (y), which is the direction in which the opening 540 passes through the side portion 520. If the opening 540 overlaps the dimples DP, it may be difficult to obtain a sufficient turbulent flow effect as the airflow may escape through the opening 540 before passing the dimples DP.

Referring to FIG. 6 and FIG. 7, the dimples DP formed in the main portion 510 of the shield case 50 will be described in more detail. The dimple DP may be formed to be concave from the inner surface of the main portion 510. In the region where the dimple DP is formed, the outer surface of the main portion 510 may be convex. In the main portion 510, a thickness of the region where the dimple DP is formed and a thickness of a region where the dimple DP is not formed may be substantially equivalent. The dimple DP may be a circular shape having a diameter D in a plan view, and may be formed to have a depth H from the inner surface of the main portion 510. The dimples DP may be disposed such that a ratio (D:d) of the diameter D to a spaced between adjacent dimples DP is about 2:1.

The dimple DP may have an asymmetric shape. Here, the asymmetric shape indicates that the deepest point P of the dimple DP in the cross-section diagram is biased to one side from a center C of a circular arc. In the dimple DP, a distance between the center C of the circular arc (the center of the circle in a plan view) and the deepest point (P) may be referred to as an asymmetric distance A. The deepest point P in the dimple DP may be disposed farther from the fan 60 than the center C of the circular arc of the dimple DP.

In the dimple DP, a radio (H/D) of the depth H to the diameter D may be about 0.1 or more. When the ratio (H/D) of the depth H to the diameter D is less than about 0.1, the effect of improving the heat dissipation performance by the dimple DP may be insignificant. In dimple DP, the ratio (A/D) of the asymmetric distance A to the diameter D may be about 0.25. For example, the depth H may be about 0.1 mm, the diameter D may be about 1.0 mm, and the asymmetric distance A may be about 0.25 mm. In another example, the depth H may be about 0.2 mm, the diameter D may be about 2.0 mm, and the asymmetric distance A may be about 0.5 mm.

The depth H of the dimple DP may be about 0.1 mm to about 0.2 mm. As the depth H is increased, the heat dissipation performance may be improved, but it may be difficult to process the dimple DP having a depth H of about 0.2 mm or more or a ratio of a depth H to diameter D of more than about 0.2 (H/D) while having an asymmetric shape due to the manufacturing limitations of the press mold.

Dimples may also be formed in the printed board assembly PBA. For example, dimples may be formed on a surface of the integrated circuit chip that forms the signal controller 30. Dimples can also be formed on a surface of the chassis 40.

Figure 8:
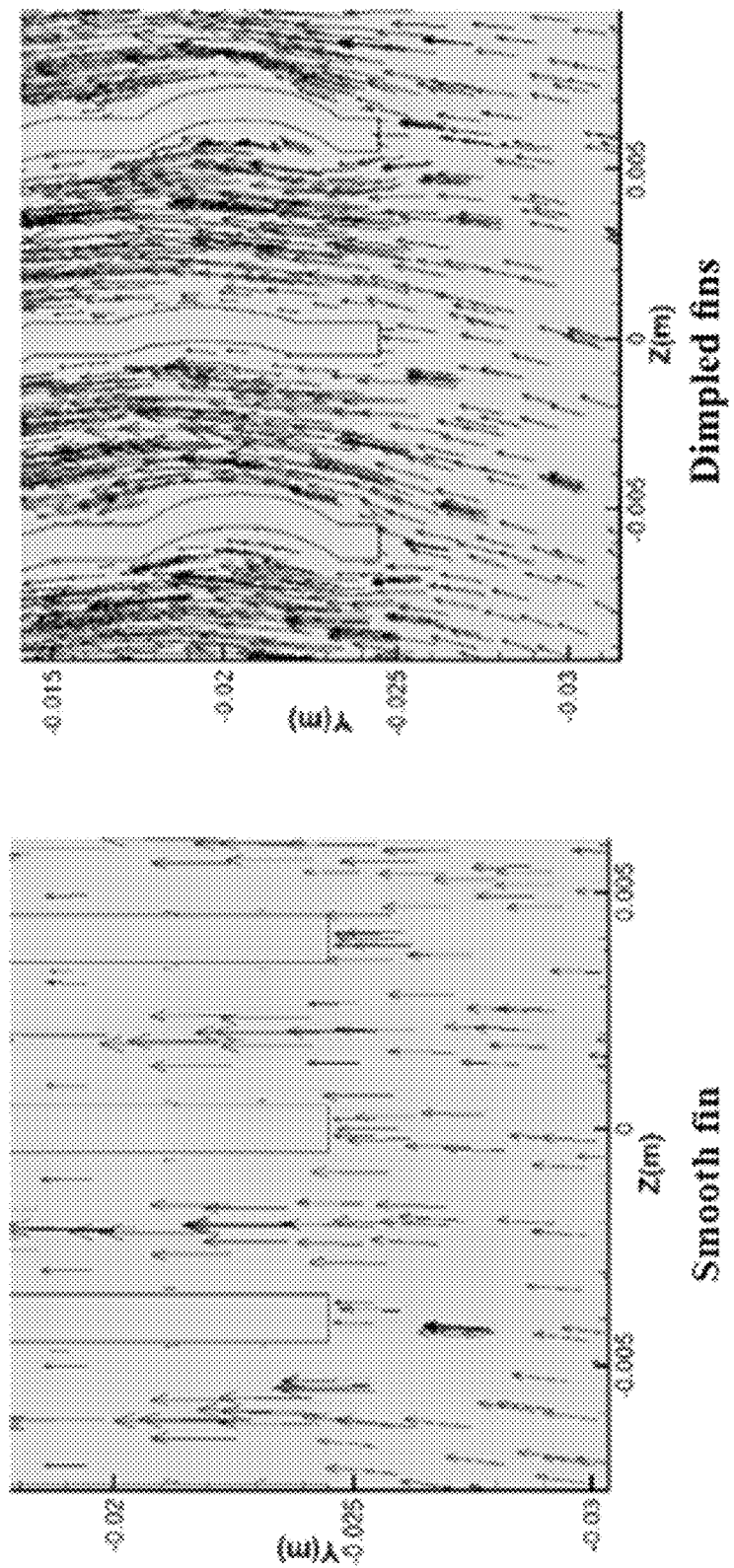
FIG. 8, FIG. 9, and FIG. 10 are graphs that respectively illustrate effects in formation of dimples.
Figure 9:
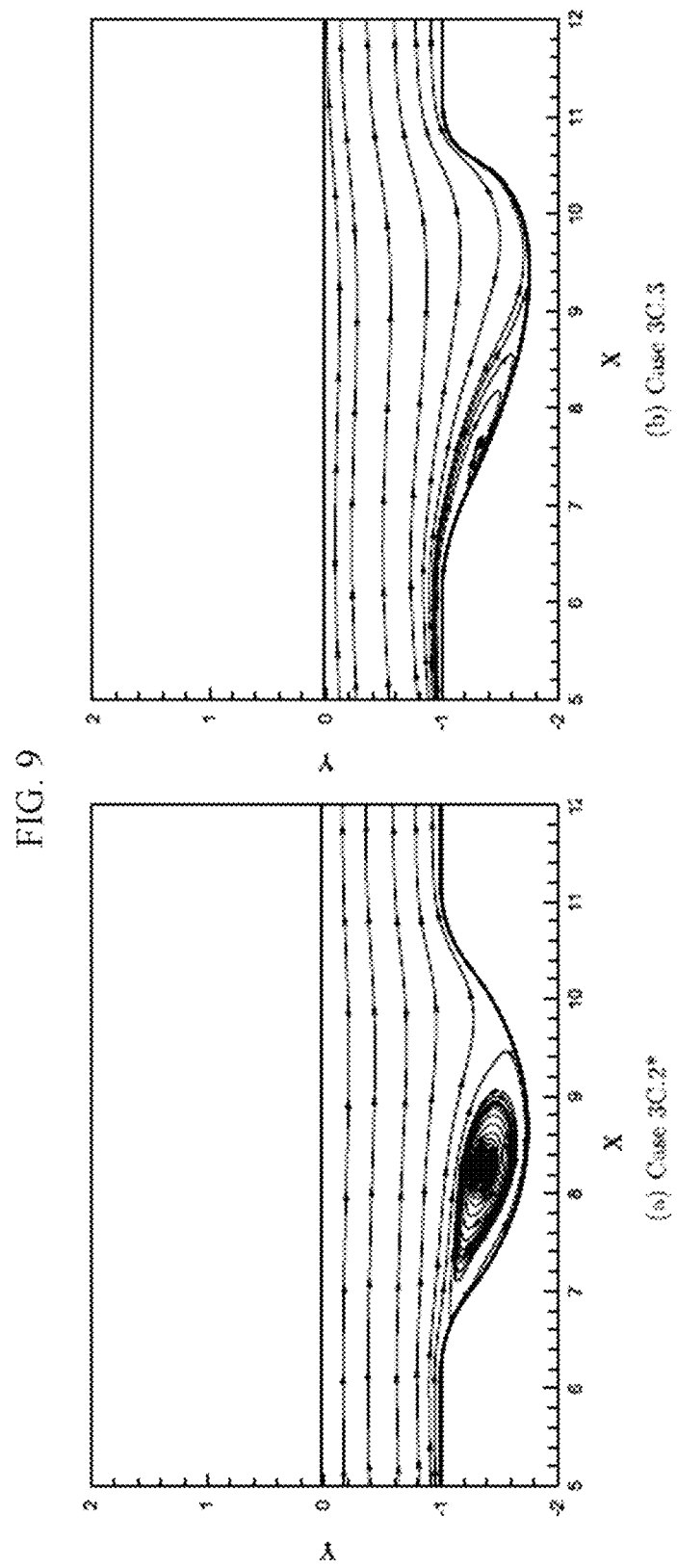
Figure 10:
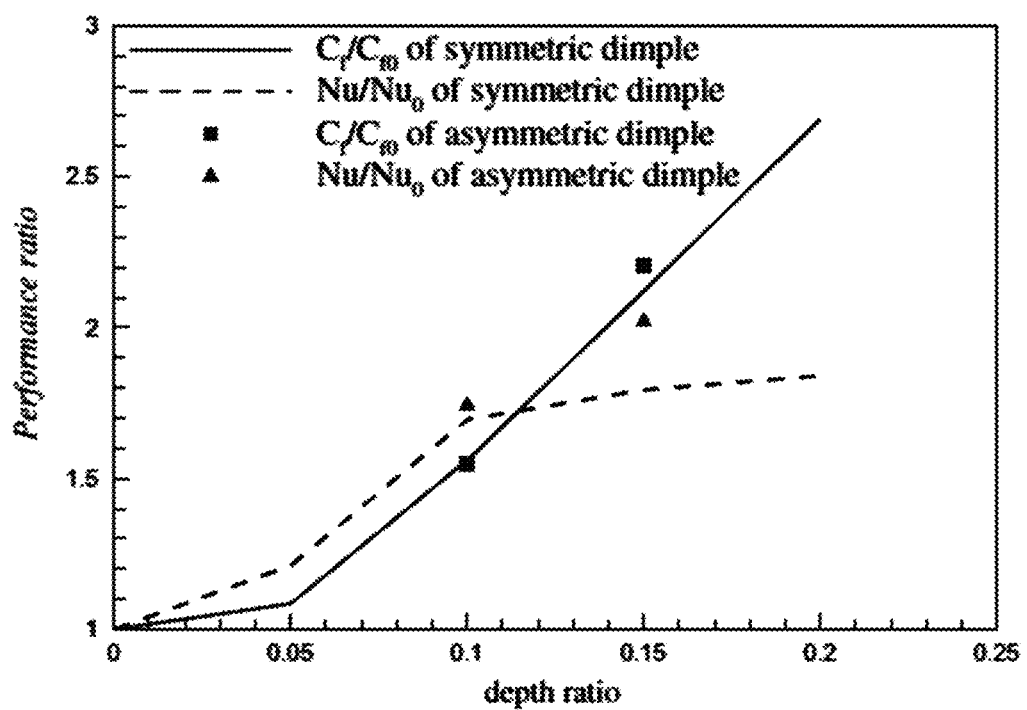

FIG. 8, FIG. 9, and FIG. 10 are graphs that respectively illustrate the effects of the dimples.

Referring to FIG. 8, the figure on the left shows the airflow passing between fins without dimples, and the figure on the right shows the airflow passing between fins with dimples. When a dimple is formed, turbulence that may have occurred due to the pressure difference caused by the dimple was observed.

Referring to FIG. 9, the figure on the left shows the airflow of a symmetric dimple, and the figure on the right shows the airflow of an asymmetric dimple. In the symmetric dimple, the turbulence was trapped within the dimple, but in the asymmetric dimple, the turbulence was not trapped within the dimple.

Referring to FIG. 10, the surface friction coefficients and Nusselt numbers for the symmetric dimple and the asymmetric dimple are illustrated. As shown in the drawing, since the Nusselt number ratio increased more in the asymmetric dimple than in the symmetric dimple, convective heat transfer may occur more effectively in the asymmetric dimple. When the convective heat transfer increases, the temperature inside the shield case 50 may be lowered. Therefore, the shield case 50 in which the asymmetric dimples DP are formed may lower the temperature of the signal controller 30 and the PMIC mounted on the control circuit board CB more than a shield case in which the symmetric dimples are formed.

Figure 11:
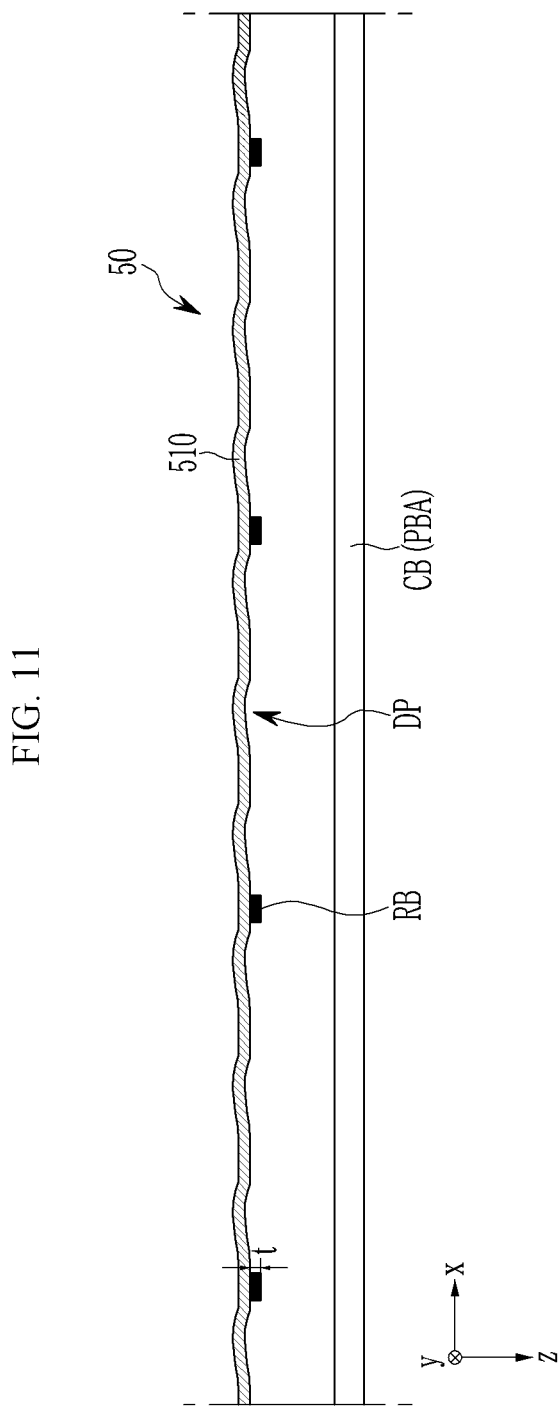
FIG. 11 is a schematic cross-sectional view of areas where the dimples and ribs are formed in the shield case that includes a combination of the dimple and the rib according to an embodiment.
Figure 12:
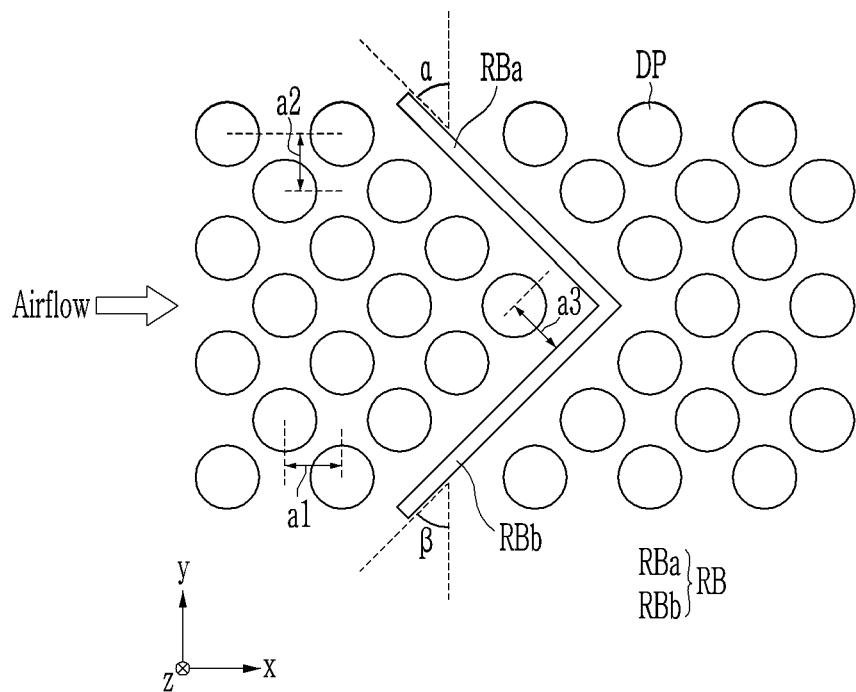
FIG. 12 is a schematic plan view of the alignment of the dimple and the rib in the shield case according to an embodiment.

FIG. 11 is a schematic cross-sectional view of areas where the dimples and ribs are formed in the shield case that includes a combination of the dimples and ribs according to an embodiment, and FIG. 12 is a top plan view of alignment of the dimple and the rib in the shield case according to an embodiment.

Referring to FIG. 11 and FIG. 12, the shield case 50 may include ribs RB, together with the dimples DP. The rib RB may be disposed between the dimples DP so as to not overlap the dimples DP. The rib RB may be attached to the inner surface of the main portion 510 or integrally formed with the main portion 510. The rib RB may be disposed or formed to protrude from the inner surface of the main portion 510 toward the control circuit board CB in the third direction. A thickness t of the rib RB may be equal to or greater than the depth H of the dimple DP. For example, the rib RB may have a thickness t of about 0.1 mm to about 1.0 mm. The rib RB may extend across the dimples DP in approximately the second direction (y) or in a direction inclined with respect to the second direction (y). The rib RB increases the flow resistance of the airflow, thereby generating turbulence. Therefore, when the rib RB is formed, the turbulence can be increased compared to the case where only the dimple DP is formed.

Referring to FIG. 12, the rib RB may be formed roughly in a V-shape between the dimples DP. For example, the rib RB may include a first part RBa extending in a direction that forms a first angle α with respect to the second direction (y) and a second part RBb extending in a direction that forms a second angle β with respect to the second direction (y). The first angle α and the second angle β may be respectively about 30° to about 60°. An angle formed by the first part RBa and the second part RBb may be about 60° to about 120°. For example, the first angle α and the second angle β may each be about 45°, and the angle between the first part RBa and the second part RBb may be about 90°. The vertex of the rib RB, where the first part RBa and the second part RBb meet, may be directed toward the first direction (x) that is approximately parallel to the airflow direction.

A distance a1 between straight lines passing the centers of adjacent dimples DP in the second direction (y) may be the same as a distance a2 between straight lines passing in the first direction (x). A distance a3 between the rib RB and the center of the dimple DP adjacent thereto may be equal to the distance a1. By forming and disposing rib RB in such a way, the effect of turbulent flow can be maximized.

The rib RB may have a V-shape or a planar shape including a V-shape. Although one rib RB is illustrated in the drawing, multiple ribs RB may be disposed at intervals along the first direction (x). The rib RB may be continuously or discontinuously disposed in the second direction, and may be formed in a shape other than the V-shape (e.g., a W-shape, a U-shape, a Z-shape, and the like).

Figure 13:
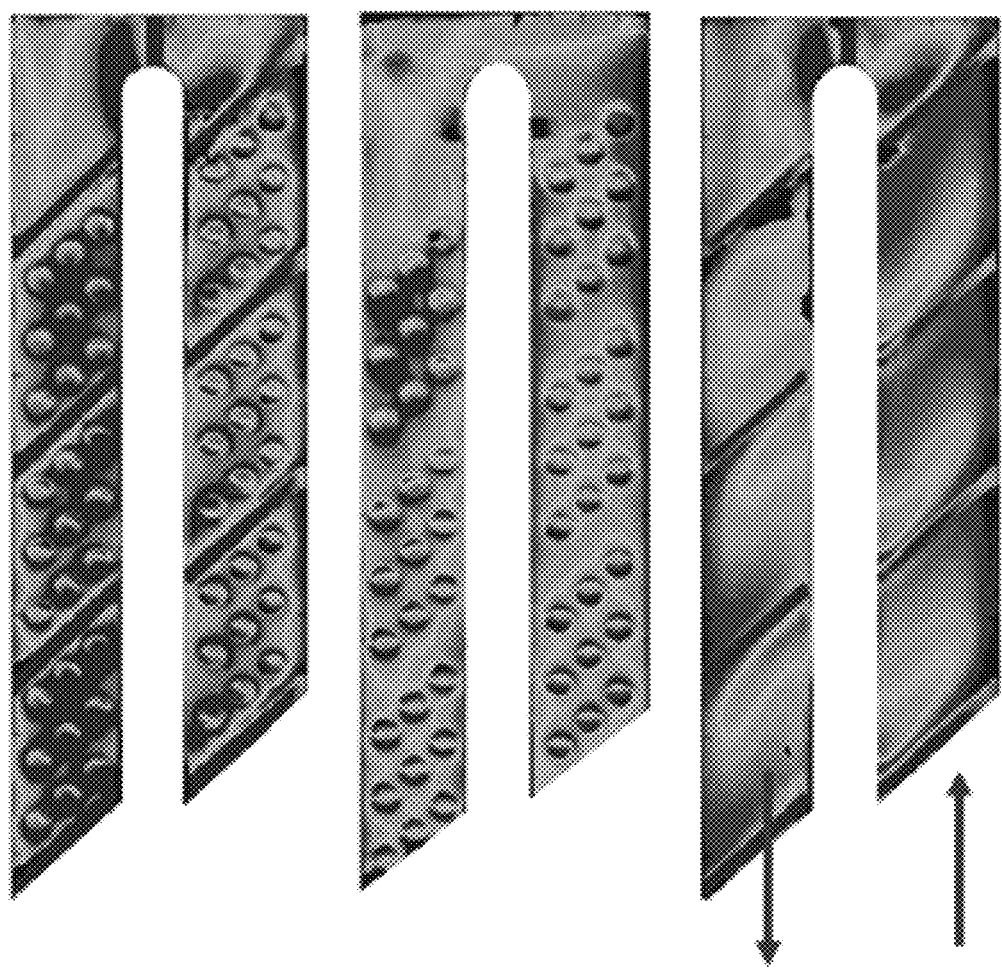
FIG. 13 shows the degree of turbulence when the rib is formed, when the dimple is formed, and when the rib and the dimple are formed.

FIG. 13 shows the degree of turbulence when the ribs are formed, when the dimples are formed, and when both the ribs and the dimples are formed.

Referring to FIG. 13, the drawing on the right shows turbulence with the ribs, the drawing in the middle shows turbulence with the dimples, and the drawing on the left shows turbulence with both the rib and the dimple. The direction of airflow is indicated by arrows in the drawing on the right. The areas of high turbulence are indicated by the dark colors in the drawing on the left. As shown in the drawing, turbulence is generated when only ribs are formed or only dimples are used, but turbulence is maximized when dimples and ribs are used together.

Figure 14:
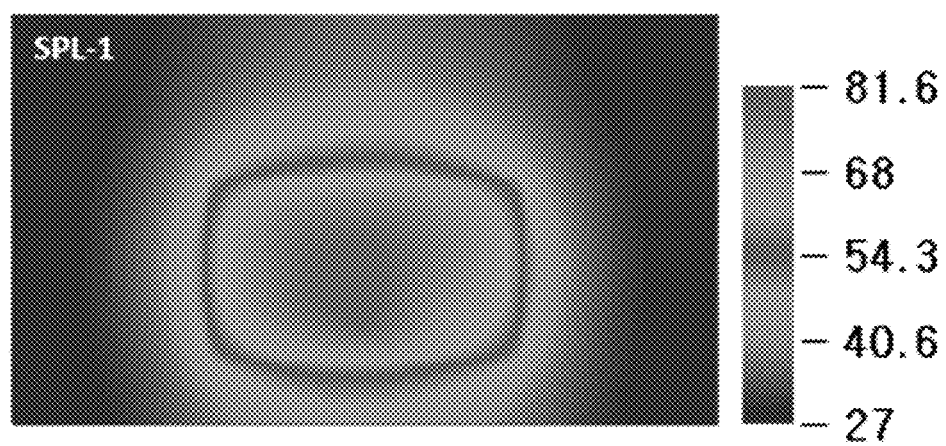
FIG. 14 shows the cooling effect when applying a shield case according to a comparative example.
Figure 15:
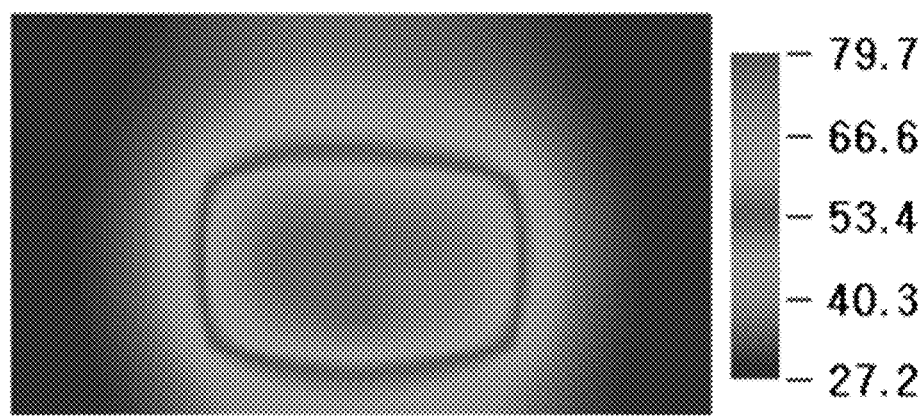
FIG. 15 shows the cooling effect when applying the shield case according to an embodiment.

FIG. 14 shows a cooling effect of a shield case according to a comparative example, and FIG. 15 shows a cooling effect of a shield case according to an embodiment.

FIG. 14 shows a temperature distribution of a surface of a display panel using a shield case without dimples, a printed board assembly PBA, and operating a fan 60. FIG. 15 shows a temperature distribution of a surface of the display panel using a shield case 50 with asymmetric-shaped dimples DP, a printed board assembly PBA, and operating a fan 60. In FIGS. 14 and 15, the temperature increases from the outside part of the display panel to the center. Referring to FIG. 14, the maximum temperature of the surface of the display panel was about 81.6° C., at the center of the display, when the comparative example shield case was used. Referring to FIG. 15, the maximum temperature was about 79.9° C., at the center of the display panel, when the shield case according to an embodiment was used. The asymmetric dimples DP obtained a cooling effect of about 1.7° C.

While the disclosure has been described in connection with practical embodiments, it is to be understood that the embodiments are not limited those disclosed. On the contrary, it is intended to cover various modifications and equivalent arrangements included within the spirit and scope of the appended claims.

What is claimed is:

1. A display device comprising:
   a display panel;
   a chassis disposed at a rear side of the display panel;
   a control circuit board disposed on the chassis;
   a shield case disposed on the control circuit board; and
   a fan disposed on the chassis and adjacent to the shield case, wherein the shield case includes:
   a main portion spaced apart from the control circuit board in a third direction; and
   side portions extending toward the chassis from opposite sides of the main portion, and
   dimples are formed in an inner surface of the main portion facing toward the control circuit board, each dimple having a circular shape in a plan view.

2. The display device of claim 1, wherein each of the dimples is concave with respect to the inner surface of the main portion and has an asymmetric shape.

3. The display device of claim 2, wherein a ratio of a depth to a diameter of the each of the dimples is about 0.1 or more.

4. The display device of claim 1, wherein
   the shield case includes an opening formed in at least one of the side portions, and
   the opening does not overlap the dimples in a second direction in which the opening penetrates the at least one of the side portions.

5. The display device of claim 1, further comprising:
   a signal controller disposed on the control circuit board, wherein the dimples overlap at least a part of the signal controller.

6. The display device of claim 1, wherein
   the shield case includes a rib disposed between adjacent ones of the dimples, and
   the rib protrudes toward the control circuit board in the third direction from the inner surface of the shield case.

7. The display device of claim 6, wherein the dimples and the rib do not overlap each other.

8. A display device comprising:
   a display panel;
   a chassis disposed at a rear side of the display panel;
   a control circuit board disposed on the chassis;
   a shield case disposed on the control circuit board; and
   a fan disposed on the chassis and adjacent to the shield case, wherein the shield case includes:
   a main portion spaced apart from the control circuit board in a third direction; and
   side portions extending toward the chassis from opposite sides of the main portion, and
   dimples are formed in an inner surface of the main portion facing toward the control circuit board,
   the shield case includes a rib disposed between adjacent ones of the dimples,
   the rib protrudes toward the control circuit board in the third direction from the inner surface of the shield case,
   the rib comprises:
      a first part extending in a direction intersecting a second direction at a first angle; and
      a second part extending in a direction intersecting the second direction at a second angle, and
   the first part and the second part intersect at an angle of about 60° to about 120°.

9. The display device of claim 8, wherein a distance between the rib and a center of a dimple adjacent to the rib is substantially equal to a distance between straight lines passing centers of adjacent ones of the dimples in the second direction.

10. The display device of claim 1, further comprising:
    a printed circuit film electrically connected to the display panel;
    a source circuit board electrically connected to the printed circuit film; and
    a cable electrically connecting the source circuit board and the control circuit board, wherein the source circuit board is disposed between the display panel and the chassis,
    the chassis is disposed between the display panel and the control circuit board, and
    the cable electrically connects the source circuit board and the control circuit board through a hole disposed in the chassis.

11. A display device comprising:
    a display panel;
    a chassis disposed on the display panel;
    a printed board assembly disposed on the chassis and including a signal controller; and
    a shield case covering the printed board assembly, wherein
    dimples are formed in the shield case, and
    each of the dimples is concave with respect to an inner surface of the shield case and has an asymmetric shape.

12. The display device of claim 11, further comprising:
    a fan disposed adjacent to the shield case, and providing an airflow to a space defined by the printed board assembly and the shield case, wherein a deepest point in each of the dimples is farther from the fan than a center of a circular arc of each of the dimples.

13. The display device of claim 11, wherein a ratio of a depth to a diameter of each of the dimples is about 0.1 or more.

14. The display device of claim 11, wherein
    the shield case includes:
       a main portion where the dimples are formed;
       a side portion extending toward the printed board assembly from the main portion; and
       an opening formed in the side portion, and
    the opening does not overlap the dimples in a thickness direction of the side portion.

15. The display device of claim 11, wherein the dimples overlap at least a part of the signal controller.

16. The display device of claim 11, wherein
    the shield case includes a rib disposed between adjacent ones of the dimples, and
    the rib protrudes toward the printed board assembly from the inner surface of the shield case.

17. The display device of claim 16, wherein the dimples and the rib do not overlap each other.

18. The display device of claim 16, wherein the rib has a "V" shape.

19. The display device of claim 11, further comprising:
    a printed circuit film electrically connected to the display panel;
    a source circuit board electrically connected to the printed circuit film; and
    a cable that electrically connecting the source circuit board and the printed board assembly, wherein the source circuit board is disposed between the display panel and the chassis,
    the chassis is disposed between the display panel and the printed board assembly, and the cable electrically connects the source circuit board and the printed board assembly through a hole formed in the chassis.

20. The display device of claim 19, further comprising:

a source driver disposed on the printed circuit film and applying a data voltage to the display panel, wherein the signal controller provides image data and a control signal to the source driver.

\* \* \* \* \*